United States Patent [19]
Glider et al.

[11] Patent Number: 5,233,618
[45] Date of Patent: Aug. 3, 1993

[54] DATA CORRECTING APPLICABLE TO REDUNDANT ARRAYS OF INDEPENDENT DISKS

[75] Inventors: Joseph S. Glider, Mountain View; David T. Powers, Morgan Hill; Thomas E. Idleman, Santa Clara, all of Calif.

[73] Assignee: Micro Technology, Inc., Anaheim, Calif.

[21] Appl. No.: 488,750

[22] Filed: Mar. 2, 1990

[51] Int. Cl.[5] ...................... G06F 11/08; G06F 11/10
[52] U.S. Cl. .................................. 371/68.1; 371/51.1
[58] Field of Search .................... 371/51.1, 21.2, 68.1, 371/40.1

[56] References Cited

U.S. PATENT DOCUMENTS

| | | | |
|---|---|---|---|
| 3,633,175 | 1/1972 | Harper | 371/10.2 X |
| 3,914,741 | 10/1975 | Bonser et al. | 371/51.1 |
| 4,020,459 | 4/1977 | Coomer | 371/51.1 |
| 4,434,487 | 2/1984 | Rubinson et al. | 371/10.2 |
| 4,530,054 | 7/1985 | Hamstra et al. | 364/200 |
| 4,814,971 | 3/1989 | Thatte | 364/200 |
| 4,819,159 | 4/1989 | Shipley et al. | 364/200 |

FOREIGN PATENT DOCUMENTS 0248091 12/1987 European Pat. Off. .

OTHER PUBLICATIONS

Honan, P., "What's New in Backup Hardware and Software", *Personal Computing*, Jun. 1989, pp. 103-110.
Matick, R., "Impact of Memory Systems on Computer Architecture and System Organization", *IBM Systems Journal*, vol. 25, Nos. 3/4, 1986, pp. 274-305.
Ng, "Some Design Issues of Disk Arrays", *COMPCON Spring '89*, 1989, pp. 137-142.

*Primary Examiner*—Stephen M. Baker
*Attorney, Agent, or Firm*—Mark D. Rowland; Joseph M. Guiliano

[57] ABSTRACT

Methods and apparatus are provided for detecting and correcting various data errors that may arise in a mass data storage apparatus comprising a set of physical mass storage devices operating as one or more larger logical mass storage devices. A method and apparatus is provided for detecting and reconstructing incorrectly routed data. A method and apparatus is also provided for detecting when one or more physical devices fails to write a block of data, and for reconstructing lost data.

3 Claims, 6 Drawing Sheets

DATA CORRECTING APPLICABLE TO REDUNDANT ARRAYS OF INDEPENDENT DISKS

BACKGROUND OF THE INVENTION

The present invention relates to sets of physical mass storage devices that collectively perform as one or more logical mass storage devices. In particular, the present invention relates to methods and apparatus for maintaining data integrity across such a set of physical mass storage devices.

Use of disk memory continues to be important in computers because it is nonvolatile and because memory size demands continue to outpace practical amounts of main memory. At this time, disks are slower than main memory so that system performance is often limited by disk access speed. Therefore, it is important for overall system performance to improve both memory size and data access speed of disk drive units. For a discussion of this, see Michelle Y. Kim, "Synchronized Disk Interleaving", *IEEE Transactions On Computers*, Vol. C-35, No. 11, November 1986.

Disk memory size can be increased by increasing the number of disks and/or increasing the diameters of the disks, but this does not increase data access speed. Memory size and data transfer rate can both be increased by increasing the density of data storage. However, technological constraints limit data density and high density disks are more prone to errors.

A variety of techniques have been utilized to improve data access speed. Disk cache memory capable of holding an entire track of data has been used to eliminate seek and rotation delays for successive accesses to data on a single track. Multiple read/write heads have been used to interleave blocks of data on a set of disks or on a set of tracks on a single disk. Common data block sizes are byte size, word size, and sector size. Disk interleaving is a known supercomputer technique for increasing performance, and is discussed, for example, in the above-noted article.

Data access performance can be measured by a number of parameters, depending on the relevant application. In transaction processing (such as in banking) data transfers are typically small and request rates are high and random. In supercomputer applications, on the other hand, transfers of large data blocks are common.

A recently developed disk memory structure with improved performance at relatively low cost is the Redundant Array of Inexpensive Disks (RAID) (see, for example, David A. Patterson, et al., "A Case for Redundant Arrays of Inexpensive Disks (RAID)", Report No. UCB/CSD 87/39, December, 1987, Computer Science Division (EECS), University of California, Berkeley, Calif. 94720. As discussed in the Patterson et al. reference, the large personal computer market has supported the development of inexpensive disk drives having a better ratio of performance to cost than Single Large Expensive Disk (SLED) systems such as the IBM 3380. The number of I/Os per second per read/-write head in an inexpensive disk is within a factor of two of the large disks. Therefore, the parallel transfer from several inexpensive disks in a RAID architecture, in which a set of inexpensive disks function as a single logical disk drive, produces greater performance than a SLED at a reduced price.

Unfortunately, when data is stored on more than one disk, the mean time to failure varies inversely with the number of disks in the array. To correct for this decreased mean time to failure of the system, error recognition and correction is built into the RAID systems. The Patterson et al. reference discusses 5 RAID embodiments each having a different means for error recognition and correction. These RAID embodiments are referred to as RAID levels 1-5.

RAID level 1 utilizes complete duplication of data and so has a relatively small performance per disk ratio. RAID level 2 improves this performance as well as the capacity per disk ratio by utilizing error correction codes that enable a reduction of the number of extra disks needed to provide error correction and disk failure recovery. In RAID level 2, data is interleaved onto a group of G data disks and error codes are generated and stored onto an additional set of C disks referred to as "check disks" to detect and correct a single error. This error code detects and enables correction of random single bit errors in data and also enables recovery of data if one of the G data disks crashes. Since only G of the C+G disks carries user data, the performance per disk is proportional to G/(G+C). G/C is typically significantly greater than 1, so RAID level 2 exhibits an improvement in performance per disk over RAID level 1. One or more spare disks can be included in the system so that if one of the disk drives fails, the spare disk can be electronically switched into the RAID to replace the failed disk drive.

RAID level 3 is a variant of RAID level 2 in which the error detecting capabilities that are provided by most existing inexpensive disk drives are utilized to enable the number of check disks to be reduced to one, thereby increasing the relative performance per disk over that of RAID level 2.

The performance criteria for small data transfers, such as is common in transaction processing, is known to be poor for RAID levels 1-3 because data is interleaved among the disks in bit-sized blocks, such that even for a data access of less than one sector of data, all disks must be accessed. To improve this performance parameter, in RAID level 4, a variant of RAID level 3, data is interleaved onto the disks in sector interleave mode instead of in bit interleave mode as in levels 1-3. The benefit of this is that, for small data accesses (i.e., accesses smaller than G+C sectors of data), all disks need not be accessed. That is, for a data access size between k and k+1 sectors of data, only k+1 data disks need be accessed. This reduces the amount of competition among separate data access requests to access the same data disk at the same time.

Yet the performance of RAID level 4 remains limited because of access contention for the check disk during write operations. For all write operations, the check disk must be accessed in order to store updated parity data on the check disk for each stripe (i.e., row of sectors) of data into which data is written. Therefore, write operations interfere with each other, even for small data accesses. RAID level 5, a variant of RAID level 4, avoids this contention problem on write operations by distributing the parity check data and user data across all disks.

Errors in data in a RAID architecture, such as those resulting from hardware failure, can manifest themselves in several ways. First, data within a data block may be corrupted during a read or write operation. Such a failure to correctly write or read data on the disk is normally detected by a check of parity, Error Correction codes (ECC) and/or Cyclic Redundancy Check (CRC) codes that are generated at the time the data is stored and that are checked each time the data is written or read. This type of check is limited to validating the data path within the disk drive.

Other potential errors in data, however, require additional error detection capability. For example, during a write operation, a drive can fail to write any data at all. In this case, in a RAID 4 or 5 architecture, a readback of the data (including a check of any parity, ECC or CRC codes) would not detect that old data is being accessed in place of the data intended to be accessed. Small disk drives often do not include special logic to detect a failure to write any data.

Also, a hardware failure may result in data being written to or read from the wrong disk or wrong sector within a disk due to misrouting of data within the controller for the RAID. On a subsequent readback of the data in the RAID 4 or 5 architectures, again no problem would be detected. Although it is known to add a logical block address type field to data when writing the data to a disk drive, this does not provide assurance that the data block at that address is valid if in the array more than one physical location may have the same logical block address. This condition may exist, for example, in an array operated as a plurality of logical units. Although, as noted elsewhere herein, previously known RAID arrays operate only as a single logical unit, a novel method for operating a set of physical mass storage devices (e.g., a RAID system) as a plurality of logical units is also referred to herein, and pursuant to this novel method the set may include more than one physical location with the same logical block address.

In view of the foregoing, it would be desirable to be able to provide a way to detect and, where possible, correct data errors resulting from misrouting of data within a data storage system comprising a set of physical mass storage devices.

It would also be desirable to be able to provide a way to detect and, where possible, correct data errors resulting from a failure to write on one or more devices while performing write requests in a such a data storage system.

SUMMARY OF THE INVENTION

It is an object of the present invention to provide a way to detect and, where possible, correct misrouted data within a multiple device mass storage system, when the data is written to and read from a storage device in the storage system.

It is another object of the present invention to provide a way to detect and, where possible, correct data errors resulting from the failure to write data to one or more mass storage devices out of a set of such devices expected to receive data during a write operation.

In accordance with the present invention, there is provided a method and apparatus for detecting incorrectly routed data within a set of mass storage devices. The method comprises providing a field in each block of stored data that identifies where that data should be located in the device set. In a particular embodiment, the field specifies the logical unit number of the device and the logical block number within the logical unit of the data block to which the data is directed.

There is also provided a method and apparatus for detecting when one or more devices fails to write a block of data. This method comprises providing another field in each block of stored data uniquely identifying the write operation by which the data was stored. This field preferably includes a time stamp, such as one specifying the time at which the write operation began. By comparing time stamps of stored data blocks when they are read, it can be determined whether or not the read data blocks were all stored during a particular write operation.

DETAILED DESCRIPTION OF THE INVENTION

1. Description of Exemplary Multiple Device Mass Storage System

To illustrate the principles of the present invention, a description is provided below of a multiple storage device mass storage system in which the present invention is embodied. It is shown that the described multiple device mass storage system can be connected in various computer systems having conventional architectures. It is also shown that the described mass storage system can include, in addition to the present invention, a novel means for detecting and recovering from an interrupted write operation caused by a power failure. This power failure recovery feature is the subject of co-pending, commonly assigned U.S. patent application Ser. No. 07/487,648, entitled "NONVOLATILE MEMORY STORAGE OF WRITE OPERATION IDENTIFIER IN DATA STORAGE DEVICE" and filed concurrently herewith in the names of David T. Powers, Randy Katz, David H. Jaffe, Joseph S. Glider and Thomas E. Idleman. Although the present invention is described in the context of a multiple device mass storage system having a RAID architecture, it will be appreciated by one of skill in the art that the present invention is useful in any multiple device storage system architecture in which data is interleaved across more than one physical storage device.

Figure 2:
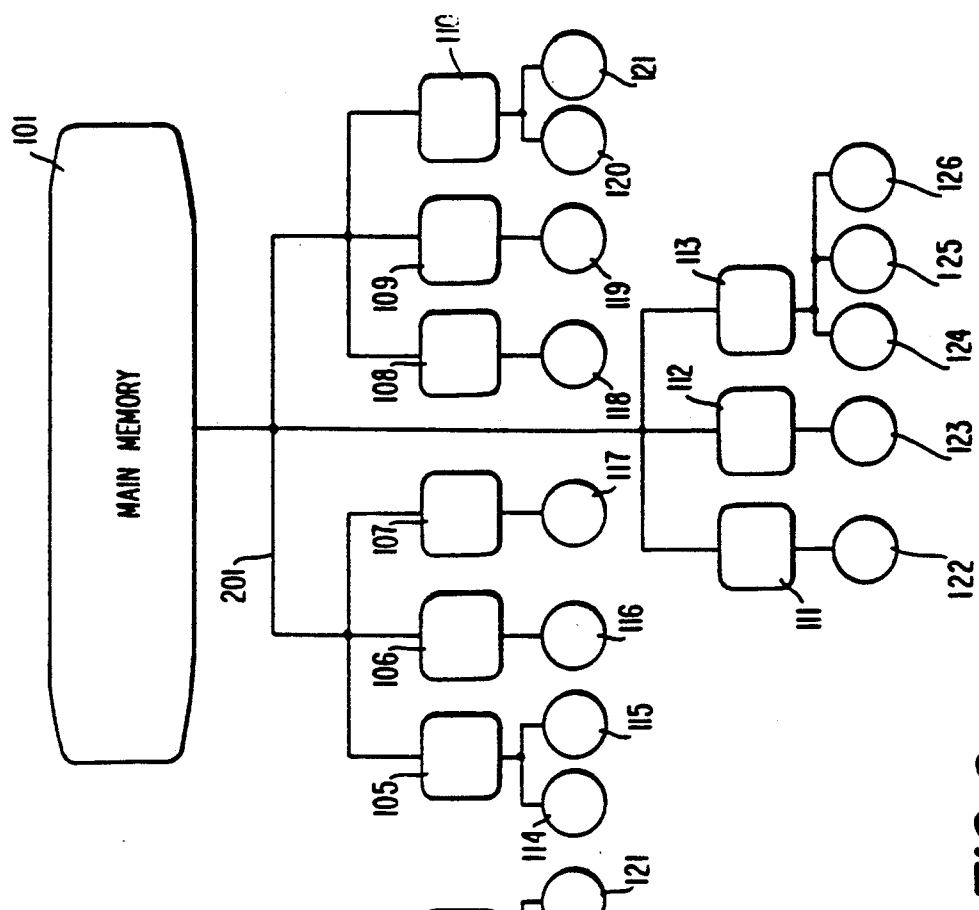
FIG. 2 illustrates a prior art bus architecture for routing data to various peripheral devices.
Figure 1:
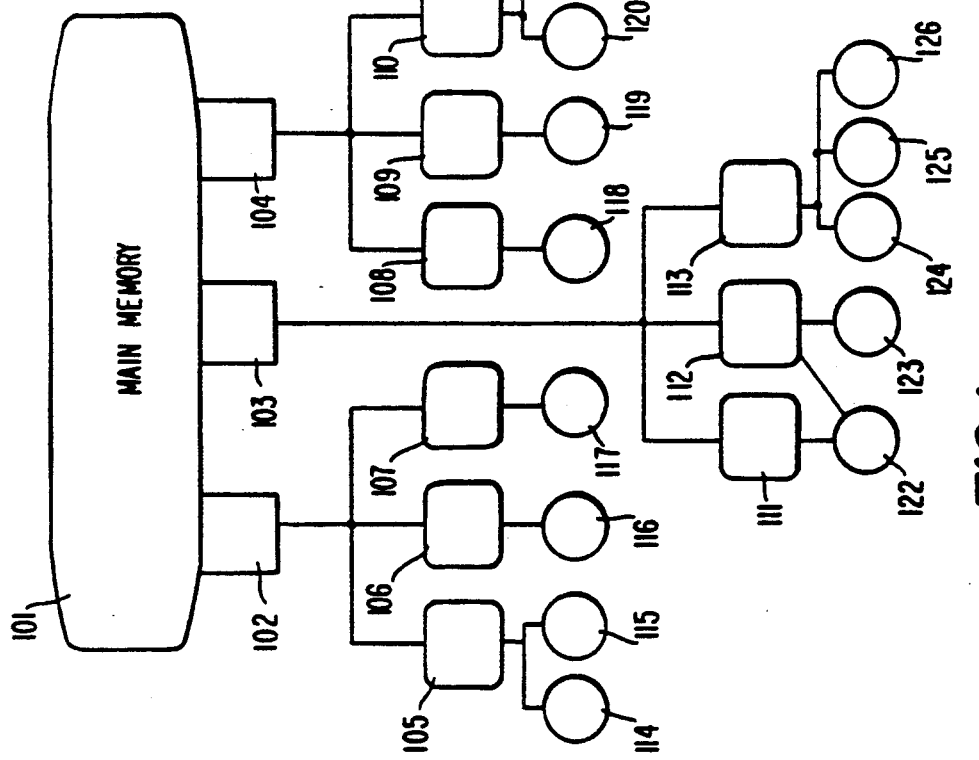
FIG. 1 illustrates a prior art channel architecture for routing data to various peripheral devices.
Figure 3:
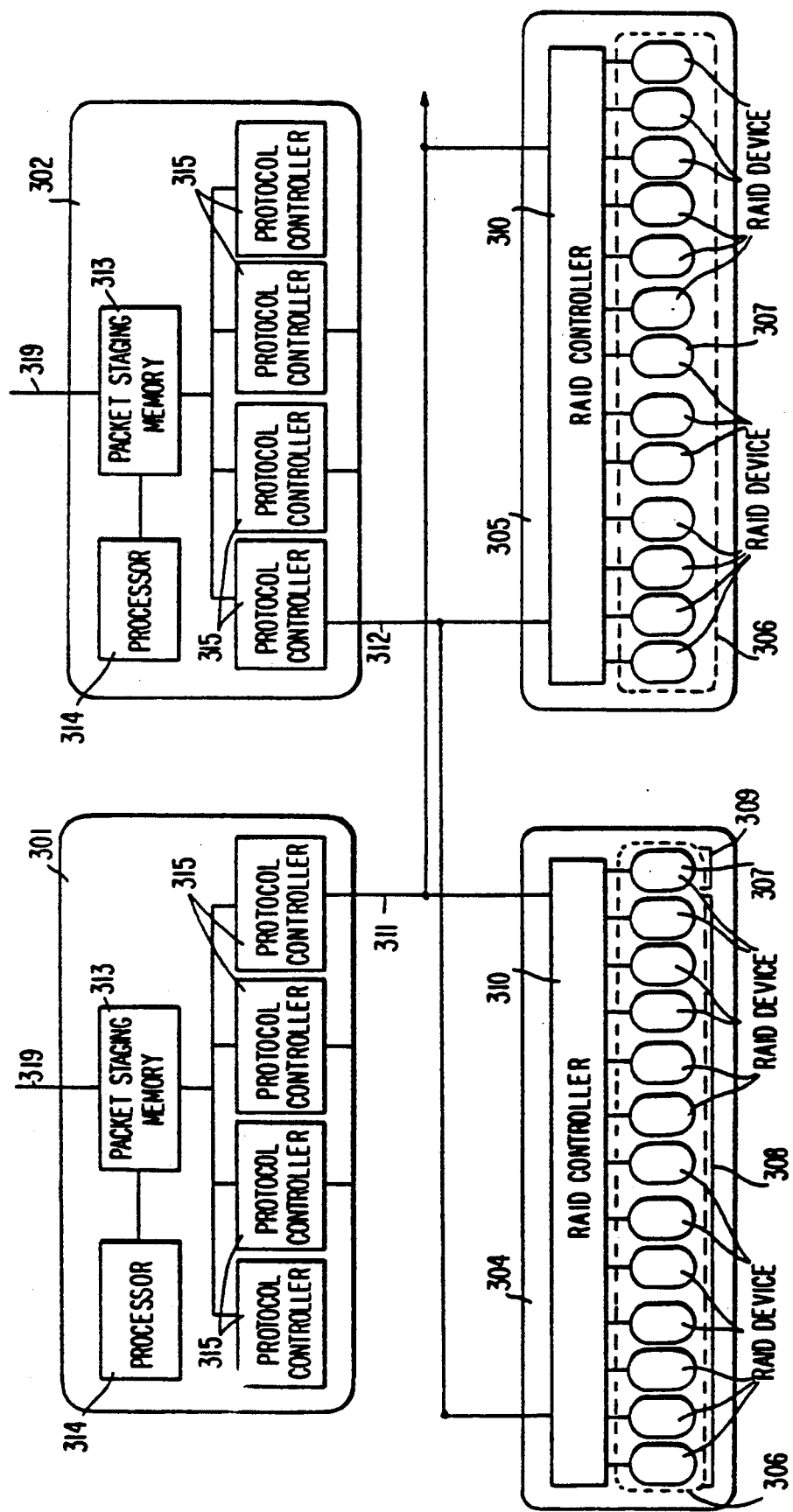
FIG. 3 illustrates coupling between RAID memories and device, controllers in a multiple device mass storage system of a type suitable for use with the present invention.

Some of the sources of data routing errors in a multiple storage device mass storage system can be seen by examination of FIGS. 1-3. In FIG. 1 is illustrated the general structure of a conventional channel architecture for routing data from main memory in a central processing unit (CPU) to any of a set of data storage devices 114-126. Data emerges from the CPU main memory 101 along any one of a set of channels 102-104 and is selectively directed to one of a set of device controllers 105-113. The selected one of these device controllers then passes this data on to a selected one of the data storage devices attached to that controller. These data storage devices can be of a variety of types, including tape storage, single disk storage and RAID memory storage. Such storage devices may be coupled to more than one controller to provide multiple data paths between the CPU main memory 101 and the storage device. This is shown, for example, by the coupling of storage device 122 to controllers 111 and 112.

FIG. 2 illustrates an alternative conventional architecture in which channels 102-104 are replaced by an input/output (I/O) bus 201. The data storage devices used in such a system also can be of a variety of types, including tape storage, single disk storage and RAID memory storage. In both of these architectures, during any data access, several switches have to be set to connect CPU main memory 101 to the storage device selected for access. When the storage device is a RAID memory, additional controls must be set to route the data within the RAID memory.

To explain, FIG. 3 shows in greater detail how a pair 301 and 302 of device controllers can be connected to a pair of RAID memories 304 and 305 in a computer system such as is shown in FIG. 1 or FIG. 2. Each device controller is connected by a bus or channel 319 to a CPU main memory. In general, each RAID memory is attached to at least two device controllers so that there are at least two parallel paths from one or more CPU main memories 101 to that RAID memory. Thus, for example, each of RAID memories 304 and 305 is connected to device controllers 301 and 302 by busses 311 and 312, respectively. As shown, bus 311 may also connect device controller 301 to additional RAID memories. Such parallel data paths from the CPU to the RAID memory are useful for routing data around a busy or failed device controller.

Within each RAID memory are a set 306 of disk drive units 307. This set includes an active set 308 of disk drive units 307 and a backup set 309 of disk drive units 307. In each of RAID memories 304 and 305 is a RAID controller 310 that routes data between device controllers 301 and 302 and the appropriate one or ones of disk drive units 307. Hardware protocol controllers 315 in each of the device controllers 301 and 302, and corresponding hardware protocol controllers in the each of RAID memories 304 and 305 (e.g., protocol controllers 403 and 404 shown in FIG. 4), handle the transfer of data between device controllers and RAID controllers. When one of the disk drive units in active set 308 fails, RAID controller 310 switches the failed unit out of the data path, recreates the failed drive unit's data and thenceforth reroutes that disk drive unit's input data to one of the disk drive units in backup set 309. Controller 310 utilizes the error correcting capability provided by the codes written onto check disks to reconstruct the data of the failed disk drive unit onto the backup unit with which the failed disk drive unit has been replaced.

The particular method by which data on a drive in a RAID architecture is reconstructed is implementation specific. In the preferred embodiment a Reed Solomon coding algorithm is used to calculate the check data that is stored on the check drives. In a particularly preferred embodiment this check data is distributed across several physical disk drives in a striped manner, like that of the previously described RAID level 5 architecture. A stripe comprises corresponding sectors across a set of disk drives, some of which sectors contain mass storage data and other of which sectors contain check data for the mass storage data sectors within the stripe. A stripe may be one or more sectors deep. Such stripes on a set of disks are grouped into one or more of what is hereafter referred to as redundancy groups. In this arrangement the physical devices comprising the check drives for a particular stripe varies from stripe to stripe. The widths of the stripes are equal (i.e., the number of physical storage devices spanned by each stripe) within a redundancy group.

The particular Reed Solomon coding algorithm used determines (or limits) the number of data blocks that can be reconstructed. For example, the Reed Solomon code may limit reconstruction to two drives out of the total number of drives in a stripe (including drives holding check data). If in this case more than two drives in the stripe are determined to be inconsistent, the Reed Solomon code is incapable of reconstructing any of the data. As used herein, the term "inconsistent" means that the data, when processed using the Reed Solomon code with the other data in the stripe, does not result in the check data stored for the stripe. For this reason, it may be desired to divide a multiple device mass storage system having a RAID architecture into a plurality of separate redundancy groups. Such an implementation is described in greater detail in co-pending, commonly assigned patent application Ser. No. 07/488,749, filed concurrently herewith in the names of David H. Jaffe, David T. Powers, Kumar Gajjar, Joseph S. Glider and Thomas E. Idleman, and entitled "DATA STORAGE APPARATUS AND METHOD" (now U.S. Pat. No. 5,166,939), which is hereby incorporated by reference in its entirety.

Assuming that the number of drives to be reconstructed is within the limit imposed by the Reed Solomon code used, reconstruction is generally accomplished as follows. First, all data blocks across the redundancy group stripe that includes the drive (s) to be reconstructed are read. Also read is the check data corresponding to that stripe. Error correction circuitry (e.g., redundancy group error correction circuitry 408 of FIG. 4) then uses the check data and the valid data blocks to regenerate the data that should have been written to each data block that is inconsistent with the remainder of the stripe. The error correction circuitry can be of any suitable type for manipulating the data in accordance with the algorithm of the particular Reed Solomon code used. How this circuitry generates the check data and how it regenerates inconsistent data are not within the scope of the present invention—it is intended that the present invention be applicable to any system in which it is desired to be able to detect and correct data errors resulting from a failure to write one or more data blocks involved in a write operation, regardless of the particular reconstruction technique used.

Thus, by replacing a single, conventional physical storage unit with a set of disk drives operating together as a larger unit an additional level of data path branching and switching is introduced that may incorrectly direct data to an incorrect disk drive unit.

2. Detection Of Misrouted Data

In one aspect of the present invention, there is provided a way to enable incorrectly routed data to be detected. This is accomplished as follows. When data is stored in one of the disk drive units, extra fields (e.g., fields 501 and 502 of FIG. 5) are included in each block of stored data. These extra fields contain data that identifies where that data should be located in RAID memory. In a preferred embodiment, the extra field 501 specifies the logical unit number of the device to which the CPU associated with main memory 101 directed the data and field 502 specifies the logical block number of the data block to which the CPU directed the data.

A brief discussion is appropriate here concerning logical units, logical unit numbers, logical blocks and logical block numbers. A logical unit number (LUN) is the number assigned by a CPU to an external mass storage address space, which may be mapped to one physical mass storage device, a plurality of physical mass storage devices, or any portion of one or more such devices. The LUN is transmitted by the CPU in a data access command to identify the external device as the one to take part in the data access. In response to the logical unit number, various switches within a data path from the CPU to the selected external device are set to direct the data to or from the device. Known RAID device sets are conventionally operated such that the CPU sees the RAID memory as one logical disk drive device. A preferred method for configuring data on a set of physical storage devices to operate the set as more than one logical storage device is described in the aforementioned co-pending patent application entitled "DATA STORAGE APPARATUS AND METHOD."

Figure 4:
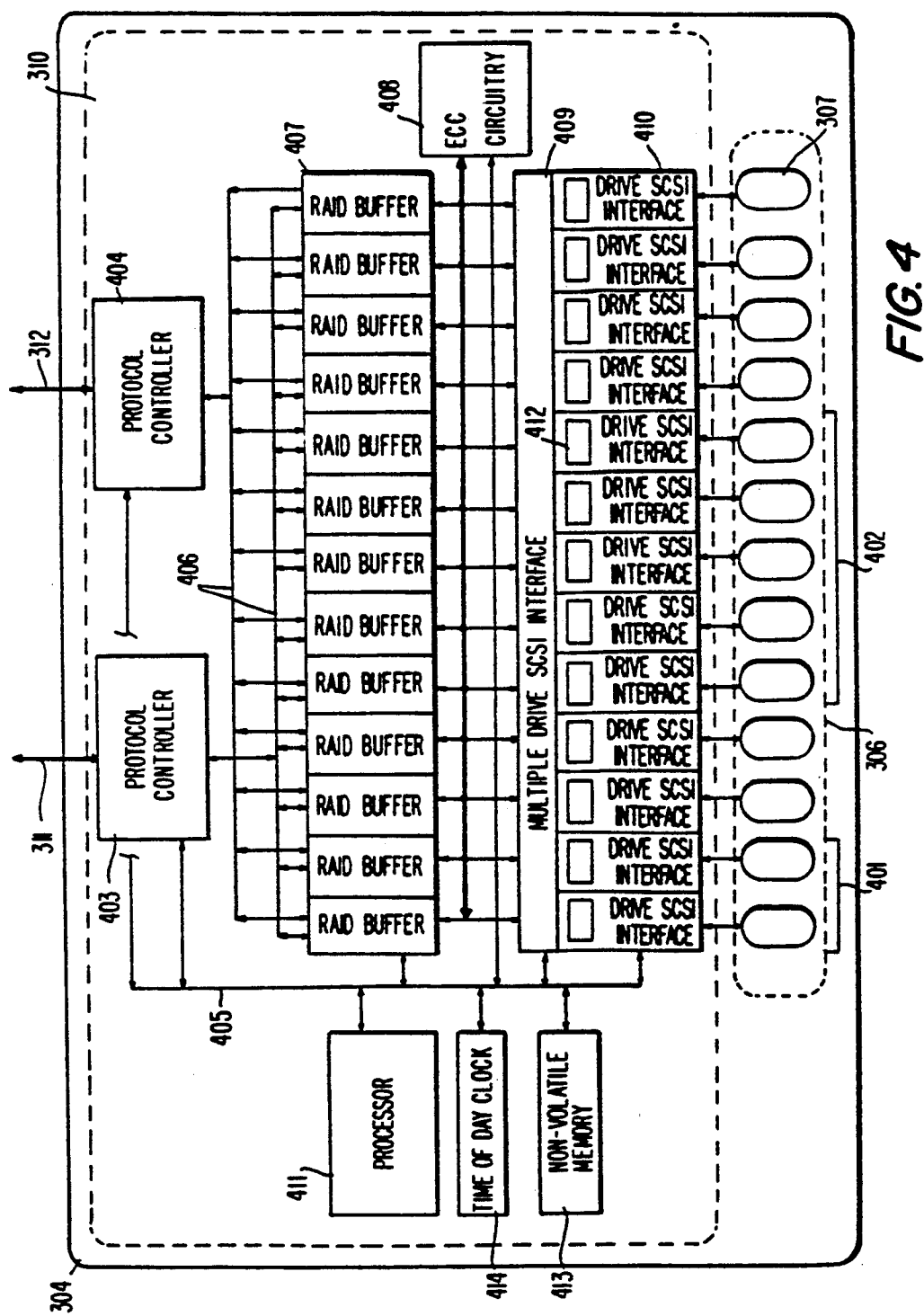
FIG. 4 illustrates RAID memory 304 of FIG. 3 in greater detail and illustrates hardware used to implement detection of data errors arising from data misdirection and/or hardware failure in accordance with the principles of the present invention.

In accordance with the preferred method of configuring data, blocks of data (sector sized) from a single write operation from the CPU are written across several physical disk drives although, as far as the CPU is concerned, it has written data to a single "logical unit," typically in one sector increments. Such a logical unit comprises one or more data groups. As described in greater detail in the above-referenced patent application entitled "DATA STORAGE APPARATUS AND METHOD," each data group is a logically contiguous group of data blocks (i.e., sectors) bound by a single redundancy group. Data groups can be configured as desired to provide within the RAID memory 304 different logical units having various performance characteristics. FIG. 4 shows a particular exemplary configuration of RAID memory 304 in which several disk drive units 307 have been grouped into separate logical units 401 and 402. Each logical unit may separately include its own check data or alternatively, the two logical units may be incorporated into a larger redundancy group— for example, one formed across all disk units 307 in active set 308.

The memory of each physical disk drive device is divided into physical blocks of memory, each of which is identified internally in the device by a physical block number (PBN). A logical block number (LBN) or logical block address (LBA) is the number transmitted by a CPU to a data storage device to access a block of data identified by this number. In a physical disk drive unit, some of the physical blocks may be bad and other physical blocks may be needed for overhead operations and are therefore not available to accept user data. A unique LBN or LBA is assigned to each physical block of a logical unit that is available for user data.

Referring now to FIGS. 3 and 4, the detection of incorrectly routed data in accordance with the principles of the present invention is illustrated for the case of data passing through device controller 302 to and/or from RAID memory 304. Device controller 302 includes a processor 314 that interprets CPU commands, identifies the appropriate logical unit number and the logical block number with which a command is concerned and transmits this information to RAID memory 304. When data is written to a logical unit (such as logical unit 401 or 402 in FIG. 4) within RAID memory 304, the logical unit number and logical block number are prepended to the data block received from the CPU while the data is being held in a packet staging memory 313 within device controller 302. Subsequently, in one of the SCSI (Small Computer System Interface) interfaces 410 within multiple drive SCSI interface 409 of RAID 304, the data is routed to the appropriate disk drive units within RAID memory 304. However, before transferring the data block to a particular disk 307, the logical unit number and logical block number prepended to the data are checked against expected values previously transmitted to RAID memory 304 by processor 314 of device controller 302. This check takes place while the data block is passing through multiple drive SCSI interface 409. If the expected and received values do not agree, the transfer of the data block is retried and, if a discrepancy still exists, then an unrecoverable error is reported to the CPU.

When data is read from one of the disk drives 307, the logical unit number and logical block number stored with the data are compared against the expected values identified from the CPU read command by processor 314. Such comparison is made both as the data passes through drive SCSI interface 410 and as it passes through packet staging memory 313 in device controller 302 on its way to the CPU. If a discrepancy is detected, the data transfer is terminated and the read operation is retried. If a discrepancy still exists, then the data block is either regenerated using the disk array (e.g., using redundancy data on check disks) or an unrecoverable error is reported to the CPU. In addition, a further recovery operation takes place as follows. The LBN and LUN read from the data block, which were found to be incorrect, point to another data block within RAID memory 306. This data block is marked as corrupted, along with the stripe in which it resides. Subsequent CPU attempts to read or write this stripe will be rejected until the stripe is reinitialized by the CPU or other means.

3. Detection Of Failure To Write

Another extra field (505 of FIG. 5) is included in each block of stored data to enable the RAID controller 310 to detect failures to write due to a drive failure. This extra field contains data that identifies a write operation uniquely. In a preferred embodiment, this field specifies the time at which the write operation is started by RAID controller 310, and is referred to herein as a time stamp. As described in Section 6 herein, the time stamp field can also be used to reconstruct data if a power failure interrupts execution of a CPU write request (e.g., a power failure affecting RAID controller 310).

Before any write operations are started on any disks, a time value is read from a real time clock 414 of FIG. 4 and is stored in register 412 in the drive SCSI interfaces 410 associated with the write request. The write operations are then started and the time stamp that was written into the drive SCSI interfaces 410 is appended to each data block associated with the write request (including blocks of check data), thereby storing the CPU data, the associated prepended data and the associated appended data into RAID memory.

In response to each read request from a CPU, for all data blocks in each data group that are read to satisfy that read request, the time stamps stored with the data are compared against each other by the following procedure. In each drive SCSI interface 410 of multiple drive SCSI interface 409, the time stamp from the data block is loaded into a register 412 dedicated to holding such time stamps and all such time stamp registers within multiple drive SCSI interface 409 that are associated with the read request are compared using compare circuitry within multiple drive SCSI interface 409. All of the time stamps are expected to be equal. If a discrepancy is detected, then the read request is retried. If the discrepancy is again detected and the number of disks containing an older time stamp is within the limit that can be reconstructed using the check disk(s), then the sectors on the devices holding older data are reconstructed to bring the data up to date with the most recent (i.e., newest) time stamp on the data blocks involved in the read request. If the number of disks containing an older time stamp is not within the limit that can be reconstructed using the check disk(s), then a nonrecoverable error is reported to the CPU so that corrective action can be taken such as calling for backup tapes to reconstruct the data. In addition, the stripe must be declared as corrupted and subsequent data accesses to it must be rejected until the CPU or other means reinitializes the stripe.

4. Stored Data Block Structure

Figure 5:
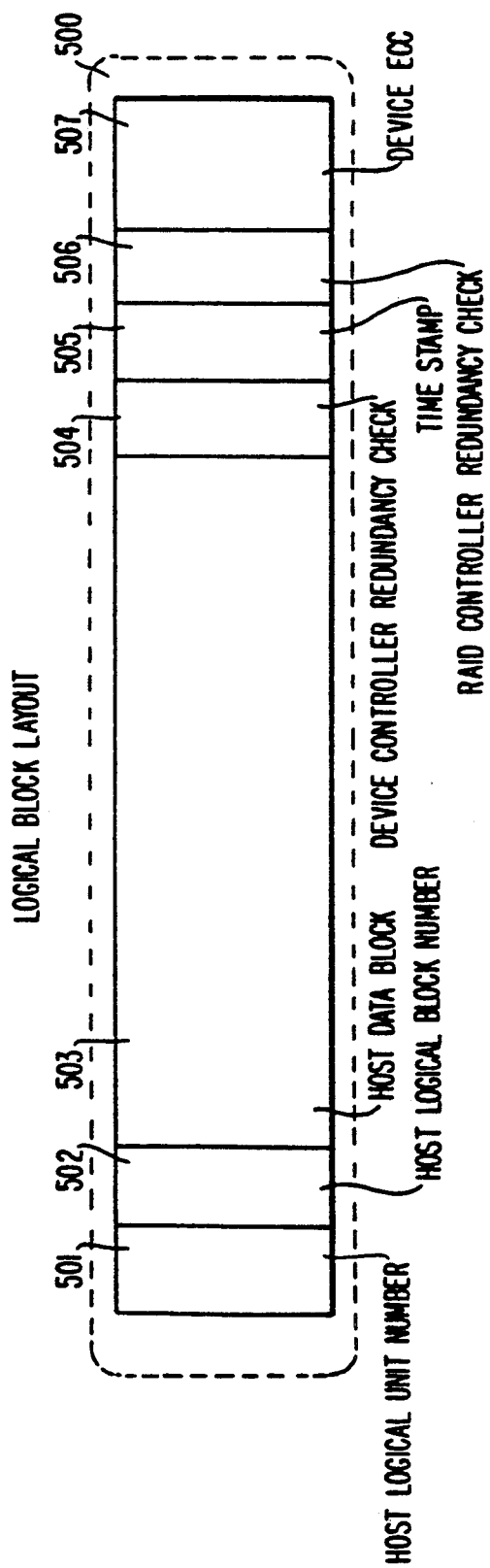
FIG. 5 illustrates a data block layout that includes additional data fields that enable detection of misdirection (i.e., incorrect placement) of data and/or data errors arising from hardware failure in accordance with the principles of the present invention.

FIG. 5 shows a preferred arrangement for a sector-sized block of data as it is stored on a disk drive in accordance with the principles of the present invention. As indicated in FIG. 5, each data block 500 stored in a disk drive preferably has several error checking fields in addition to the CPU data 503. The first error checking fields 501 and 502 are error checking fields prepended by the device controller 302 during a CPU write request and stripped by device controller 302 during a CPU read request. In this embodiment, these error checking fields contain the logical unit number 501 and the logical block number 502 for the associated CPU data 503 contained in that data block. Inclusion of these fields allows the disk storage system to detect misdirected data blocks as previously described.

The third field is the CPU data block 503 as sent from or to CPU bus or channel 319. The fourth field is a CRC code 504 appended by device controller 302 on transmission to RAID controller 310 and checked by RAID controller 310. CRC code 504 is checked again and stripped by device controller 302 on receipt from RAID controller 310. Inclusion of this field 50 allows the disk storage system to detect random data errors occurring on the bus between the device controller and the RAID controller.

The fifth field is a time stamp 505 appended by RAID controller 310 on a write operation and checked and stripped by RAID controller 310 on a read operation. Inclusion of this field allows the disk storage system to detect the failure to write and/or retrieve the correct sector due to disk drive failures and/or power failures.

The sixth field is a CRC code 506 appended by the RAID controller on a write operation and checked and stripped by the RAID controller on a read operation. As previously described, inclusion of this field allows the disk storage system to detect random bit errors occurring within the data block covering the additional device controller CRC 504 and time stamp 505 fields, during transmission between the disk and the RAID controller.

The seventh field contains the results of an error correction code (ECC) calculation 507 appended by the disk drive on a write operation and checked and stripped by the disk drive on a read operation. Inclusion of this field allows the disk storage system to detect and possibly correct random bit errors occurring in the serial channel from the disk drive to disk platter and other media errors.

Additional fields may be provided for purposes of performing other data handling functions. For example, the disk drive may append a track identification number and a sector identification number to the stored data for internal drive operations.

5. Time Stamping In Transaction Mode

A RAID memory may be operated in a transaction processing mode where data accessed by a CPU write or read request comprises a single block or a number of blocks of data (e.g., sectors) on a logical unit. For a read operation, only the particular drive or drives on which the block or blocks are located will be accessed. For a write operation, one or more disk drives containing check data are accessed in addition to the drive or drives on which the block or blocks of data are located. Assuming, however, that only a single drive is involved in the read operation, a comparison check of the time stamp associated with the requested data block or blocks can not be accomplished in the manner previously described to validate the data because no other drives are accessed in the read.

Figure 6:
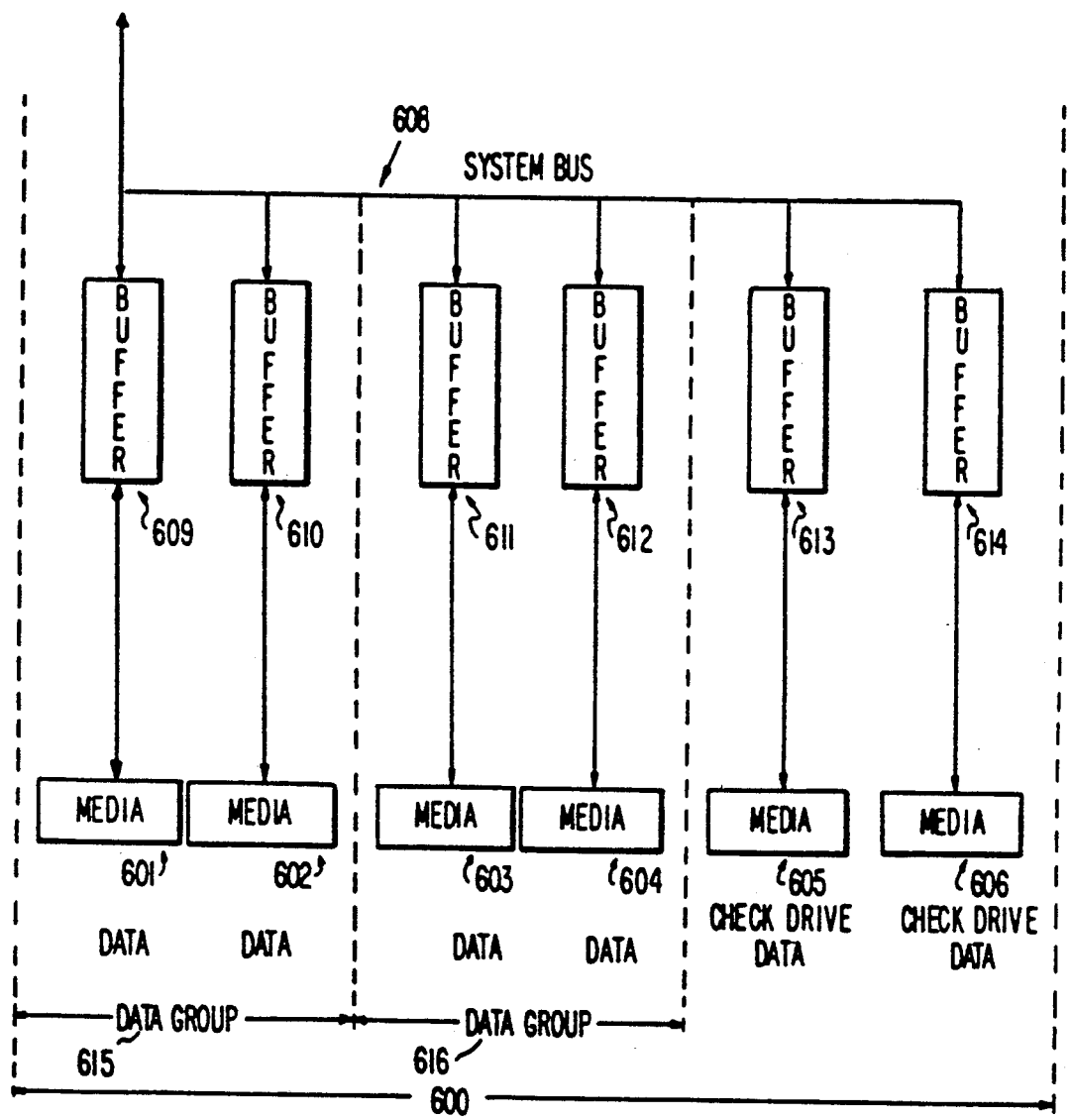
FIG. 6 illustrates an array of mass storage devices in accordance with the principles of the present invention including four data storage devices divided into two data groups, and a check device.
Figure 7:
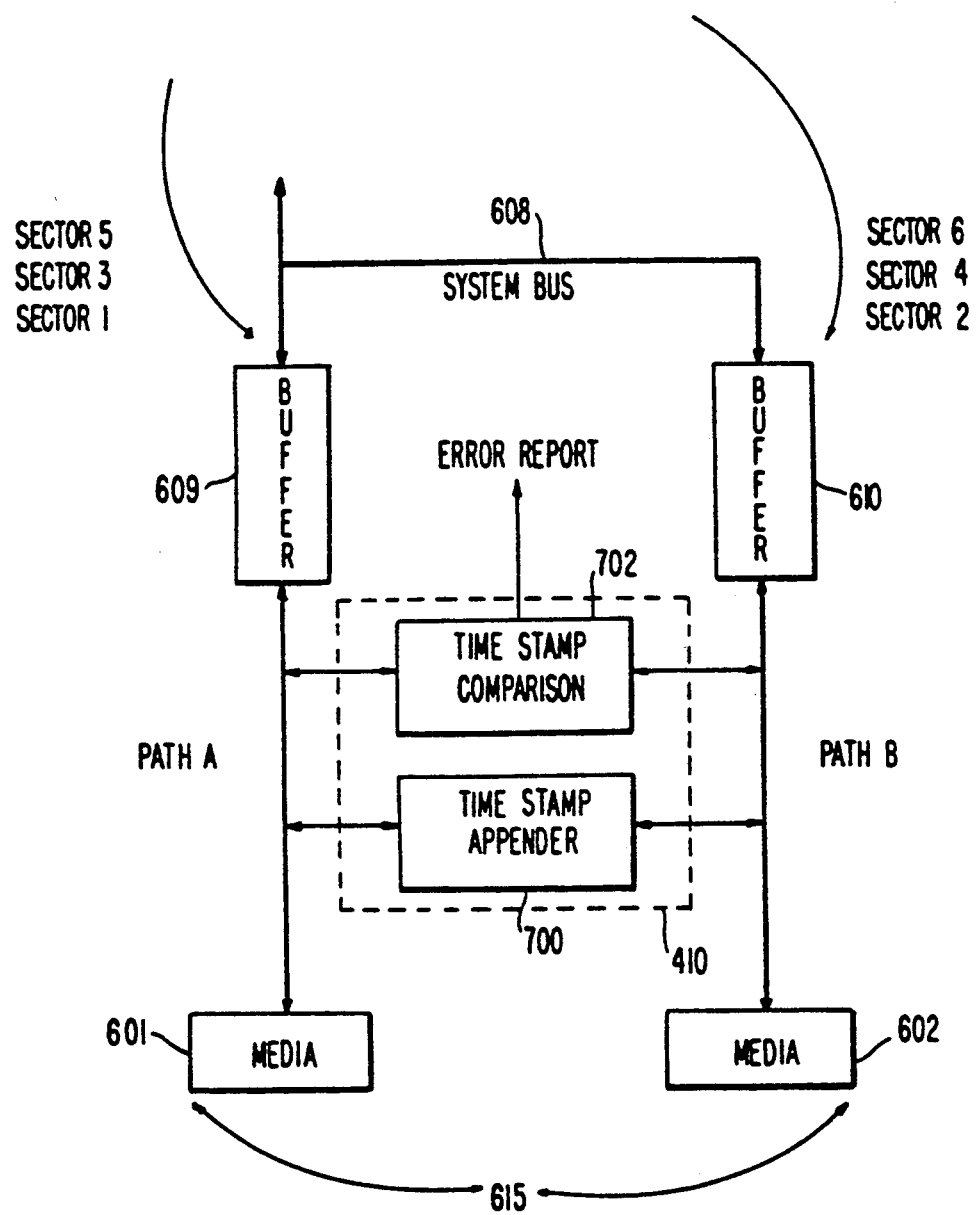
FIG. 7 illustrates an example of the operation of a data group including two mass storage devices.

FIGS. 6 and 7 illustrate an embodiment of the time stamp aspect of the present invention particularly preferred for transaction processing applications. FIG. 6 shows an array 600 of physical storage devices 601-606. Devices 601-604 store blocks of transaction data. Devices 605 and 606 operate as check drives for the array and are used to regenerate data if one or two of devices 601-604 fails. It is to be understood also that if one or both of devices 605 and 606 fail, the check data stored on these drives can be reconstructed from the data on devices 601-604. Within array 600 are defined two data groups 615 and 616. Each data group may comprise a separate logical unit (e.g., logical unit 401 of FIG. 4), or together they may be included within a larger logical unit (e.g., logical unit 402 of FIG. 4). Data group 615 includes devices 601 and 602, and data group 616 includes devices 603 and 604. Data is transferred between each of devices 601-606 and a system bus 608 (e.g., bus 406 of FIG. 4) via a corresponding one of buffer memories 609-614 (e.g., buffers 407 of FIG. 4). When array 600 is operated in transaction mode, such that a write or read request may concern only a single block of data, all accesses to data on any of devices 601-604 causes both devices of the data group including the device on which the data block is located to be accessed. This applies to both write and read requests. Thus, for example, if a block of data is to be written to only device 601, both device 601 and device 602 will be accessed together in the same write command issued to data group 615. The new host data block will be written to device 601 with an appended time stamp of the type previously described. Although no new host data is written to device 602, the same time stamp written to device 601 is written to the block location on device 602 corresponding to the block location on device 601 in which the new host data is written and to 605 and 606 on the corresponding check data blocks. On a subsequent read request concerning the data block on device 601, the time stamps on devices 601 and 602 are compared. This comparison of time stamps is made to ensure that new data was written to device 601 when the write command to data group 615 was issued.

A Write command to a data group is typically accomplished by a read-modify-write operation for purposes of updating the check data on devices 605 and 606. This operation involves first reading the old data in the block to be written, as well as the old data in the corresponding block of the other device in the data group and the check data associated with those blocks. For example, assuming again that new data is to be written to a block location in device 601, the old data in the block location is read into buffer 609. At the same time, the old data in a corresponding block location in device 602 (which is not to be changed) is read into buffer 610. Also, the old check data on devices 605 and 606 is read into buffers 613 and 614. Then, the data in buffer 609 is updated, as is the check data in buffers 613 and 614. The contents of buffers 609, 610, 613 and 614 are then written respectively to devices 601, 602, 605 and 606. During this write operation, a time stamp is appended to the data transferred to devices 601 and 602, as well as to the check data transferred to devices 605 and 606.

Although the array 600 of FIG. 6 is arranged such that check data for the entire array is located on devices 605 and 606, it is to be understood that the data group configuration can be used as well in arrays in which the check data is distributed throughout the devices of the array, as in RAID level 5 or in any of the preferred data structures described in the previously-referenced co-pending patent application entitled "DATA STORAGE APPARATUS AND METHOD".

In addition, although data groups 615 and 616 are shown as each comprising two physical devices, such data groups may comprise any plurality of physical devices, or portions of any plurality of physical devices, and may as well be used for applications other than transaction processing, as set forth for example in the previously-referenced co-pending patent application entitled "DATA STORAGE APPARATUS AND METHOD."

FIG. 7 illustrates an example of how a series of data blocks each of sector size can be written to and read from devices 601 and 602 configured as a single data group having logically contiguous sectors numbered 1-6. For purposes of illustration, assume that sectors 1 and 2 are a pair of corresponding sectors of devices 601 and 602 respectively. Likewise, assume sectors 3 and 4, and sectors 5 and 6 are corresponding pairs of sectors in devices 601 and 602, respectively. New data may be written to an individual sector of either device 601 or 602, or new data may be written to corresponding sectors of devices 601 and 602 in parallel, but in either case both devices 601 and 602 are accessed for each transfer. For example, when writing new data to either sector 1 of device 601 or sector 2 of device 602 or to both, a read operation is performed first in which the old data in sectors 1 and 2 is read into buffers 609 and 610 respectively. The data in one or both buffers is modified appropriately with the new data, and the data in the buffers are written back to the devices 601 and 602. As indicated by box 700, a time stamp is appended to both sectors 1 and 2 as the data is transferred along paths A and B to devices 601 and 602 respectively. When reading from either sector 1 or 2 or both, the data from both sectors is transferred to buffers 609 and 610, and the corresponding time stamps stored with sectors 1 and 2 are compared during the transfer as indicated by box 702. As an example, the functions of appending and comparing time stamps may be accomplished in a drive interface circuit such as SCSI drive interface circuit 410 of FIG. 4. If a discrepancy between the stamps is detected, indicating that a previous write to the devices 601 and 602 was not successfully completed, the read operation is retried. If the discrepancy reoccurs, then either reconstruction is attempted or an error report is generated as previously described.

6. Power Failure Interrupted Write Operation

A power failure could occur at any time during execution of a CPU write request causing an interruption of write operations associated with the write request. If such a power failure does occur (for example, the RAID controller loses power), then the write request can end in any one of the following three states: (1) none of the write operations were completed; (2) some of the write operations were completed; or (3) all of the write operations were completed.

A fourth possibility, for the following reasons, is so remote as not to be of significant concern. This possibility is that a write operation on a disk is discontinued part way through writing a data block onto a disk platter. When power fails, there is sufficient energy stored to allow the disks to continue writing for multiple milliseconds, which is more than enough time to complete any operations that had progressed to the point that data was actually being transferred to the disk platters. It is much more likely that, during a power failure, some disks were in the process of seeking the heads or waiting for the correct sector to come under the heads. In these cases, there may not have been sufficient time to complete the operation in the event of a power failure.

Therefore, before any write operation is started on any disk, within a nonvolatile memory 413 is stored a journal of information concerning the CPU write request and the write operations to be performed. The data stored within nonvolatile memory 413 is intended to assist in recovering from a write request interrupted by a power failure. Nonvolatile memory 413 is preferably battery backed-up random access memory or electrically erasable programmable read-only memory. Nonvolatile memory is used so that this information is not lost if a power failure occurs, thereby enabling such data to be utilized in recovering from such power failure. Successful recovery from such an incomplete write operation means that all data blocks across the redundancy group stripe that was modified by the write operations associated with the CPU write request are consistent with the check data for that stripe.

Some, and preferably all, of the following information is loaded into nonvolatile memory 413 before the start of any write operation: (1) a write process flag—an indicator that a write operation was underway when power was removed; (2) an operation sequence number—a number assigned to the write command when received from the CPU indicating the order of command reception; (3) a physical drive address; (4) a starting logical block number; (5) an ending logical block number, or an indication of the size of the write operation; (6) a time stamp; (7) and the physical addresses of check drive(s) associated with the transfer.

After all write operations occurring on drives within a logical unit (e.g., logical unit 402) associated with a write request are completed, the time stamp and other information associated with that write request are erased from the nonvolatile memory 413 by processor 411

If a power failure occurs affecting RAID controller 310, processor 411 analyzes the "consistency" of each redundancy group as part of its initialization procedure when power is restored to the RAID controller. To do so, it scans each write in progress journal stored within nonvolatile memory 413. If all journals have been erased within nonvolatile memory 413, then processor 411 knows that no write operation was partially completed at the time of power failure. If the journal has not been erased within nonvolatile memory 413, then processor 411 determines which disks 307 and which sectors on these disks were being written in response to the write request by reading the contents of the journal stored in nonvolatile memory 413. Processor 411 then causes data blocks from those sectors to be read from disks 307 to the RAID buffers 407 and then compares the time stamps from each data block with the expected value as read from nonvolatile memory 413.

If none or all of the data blocks associated with the write request were written with new data (i.e., either none or all of the time stamps have the same value as in nonvolatile memory 413), processor 411 deletes the nonvolatile memory entry for the write request, thereby indicating that the recovery operation was successfully completed. If some of the data blocks associated with the write request were written and some were not, then processor 411 determines whether it is within the error correcting capabilities of the RAID controller, using redundancy group error correction circuitry 408, to reconstruct the data blocks that have the oldest time stamp to bring them up to date with the newest data blocks (i.e, the data blocks that were successfully written before the power failure interrupted the write operation). When possible, processor 411 carries out procedures to regenerate data where the old data resides and then deletes the nonvolatile memory entry for the write request.

If processor 411 determines that the blocks with old data cannot be reconstructed and it is within the error correcting capabilities of correction circuitry 408 to reconstruct the data blocks that have the new time stamp (thereby bringing the data blocks back to the state just prior to the write operation), then processor 411 carries out procedures to do that, and deletes the nonvolatile memory entry for the write request.

If none of the above scenarios is possible, processor 411 signals an unrecoverable error to all device controllers 301-302 to which RAID memory 304 is connected. In turn, all device controllers 301-302 thus signalled will report this unrecoverable error to all CPUs to which they are connected. In addition, any further data requests to the corrupted area are rejected until the problem is corrected.

Although an embodiment has been described in which data is stored on nonvolatile memory 413 at the beginning of every write operation, the RAID memory may include a power supply having a power failure early warning system that can eliminate the need to store data in nonvolatile memory 413 at the beginning of every write operation. Such early warning systems are provided as an option in many conventional power supplies. These early warning systems are capable of detecting the onset of a power failure in advance of the actual failure, and can be used to generate an interrupt to notify a processor that a power failure is imminent. By so using a conventional power failure early warning system to generate an interrupt signal to processor 411, processor 411 is provided sufficient warning to allow it to store data concerning a pending write operation in nonvolatile memory 413 before power actually fails. Thus, in such a case there is no need to store data in nonvolatile memory 413 at the beginning of every write operation, since that same data can be stored in the non-volatile memory in the event of a power failure.

The execution of a CPU write request and a CPU read request by RAID memory 304 is described hereafter to further illustrate how the various aspects of the present invention can be integrated in the operation of RAID memory 304.

7. CPU Write Request

In a CPU write request, device controller 302 receives a request to write a certain amount of data to a certain logical unit number, starting at a certain logical block number. The request is staged in packet staging memory 313 and is read and interpreted by processor 314. A request is forwarded to RAID controller 310 through protocol controller 315 and bus 312 and is read and stored by protocol controller 404. Protocol controller 404 signals processor 411 via a bus 405 that a request is ready to be processed and processor 411 then reads and interprets the write request. Note that protocol controller 403 handles requests to RAID 304 from device controller 301.

Processor 411 determines whether the write request to the logical unit number translates to write operations on disks contained within the array 306 of disks (e.g., logical unit 401 or 402), and, if it does, then sends commands to those disks through each of their associated drive SCSI interfaces 410. Processor 411 signals processor 314 in device controller 302 to start sending data to buffers 407 of RAID memory 304. Processor 411 also reads the current time of day from clock 414 and loads the nonvolatile memory 413 with information relating to the write operations that are about to start. Processor 411 also writes the time of day into a register 412 in each drive SCSI interface 410 associated with a disk drive unit 307 that will be involved in the write request. Processor 411 also writes registers 412 in these same drive SCSI interfaces with the expected logical unit number and logical block number for the block of data arriving from the CPU.

Processor 314 signals the CPU to send data to packet staging memory 313 in device controller 302. In response, the CPU sends data block packets which are staged in packet staging memory 313. From the header information attached to the CPU data, processor 314 determines for which logical unit number and logical block number each packet is intended and prepends that information to the data block. A set of data blocks is sent to RAID controller 310 where it is temporarily stored in the buffers 407 corresponding to the disks for which each data block is intended. This data is transmitted from protocol controller 404 to these buffer memories over bus 406. The data blocks are then transferred to the corresponding drive SCSI interfaces 410 where the logical unit number and logical block number are compared against the expected values previously loaded into registers 412 at interfaces 410. If the values match, then each of these drive SCSI interfaces transfers its data block to its associated disk 307 and appends the time of day from its register 412 onto the data block. After all disk memory write operations for this write request have been completed, processor 411 erases the time stamp and other data in the nonvolatile memory 413 associated with this write request. If the logical block number or the logical unit number prepended to the data does not match the logical unit number and logical block number stored in the register 412 for that drive SCSI interface 410, then the operation is retried or an unrecoverable error is reported to the CPU.

8. CPU Read Request

In a CPU read request, device controller 302 receives a request to read a specified amount of data from a specified logical unit number, starting at a specified logical block number. The request is staged in the packet staging memory 313 and is read and interpreted by processor 314. A request is forwarded over bus 312 to the RAID controller 310 via protocol controller 315 and is read and stored by protocol controller 404. Protocol controller 404 signals processor 411 that a request is ready to be processed and the processor reads and interprets the read request.

Processor 411 determines that the read request to the logical unit number translates to read operations on disks contained within set 306 and sends commands to those disks through each of their associated drive SCSI interfaces within multiple drive SCSI interface 409. Processor 411 also loads register 412 in each of these drive SCSI interfaces 410 with the expected logical unit number and logical block number for the block of data arriving from the associated disk.

Data starts arriving into multiple device SCSI Interface 409 from those disk drive units within the indicated logical unit. At each drive SCSI interface 409 within this logical unit, the logical block number and logical unit number for each block of data are checked against the values previously loaded into registers 412 by processor 411. The time of day appended at the end of each data block is compared by multiple drive SCSI interface 409 with all of the others associated with the same read request and the same stripe. If the time stamps of all accessed data blocks are equal, then the transfer of these data blocks to their associated buffers 407 begins. The appended time stamp is stripped from each block as it is transferred to its associated buffer 407.

When all blocks have been transferred, processor 411 signals processor 314 that the data block(s) are ready to be sent to packet staging memory 313. Protocol controllers 404 and 315 carry out the transfer of the data block(s) from one or more of the buffers 407 to packet staging memory 313. As each data block is transferred to packet staging memory 313, processor 314 again checks the logical unit number and logical block number contained in the data block against the expected value stored in processor 314 and strips this prepended data from the data block to send the remainder of the data block to the CPU.

If a discrepancy occurs in any of these comparisons anywhere in the RAID controller or device controller, the transfer of data is aborted and the aborted read operation is retried. In the case of detection of misdirected data, where the detection occurs at multiple SCSI drive interface 409, a further recovery operation takes place as follows: (1) the LUN and LBN from the failing data blocks are read from processor 411; and (2) the data block in RAID memory 306 indicated by this LUN and LBN is marked as corrupted along with the stripe in which it resides. Subsequent CPU attempts to read or write this stripe will be rejected until the stripe is reinitialized by the CPU or other means. If the failure reoccurs and if it is within the limits of the error correcting capabilities of the redundancy group error correction circuitry 408, then the failing data block is regenerated using the disk array including the check disk(s) and correction circuitry 408. If the failure reoccurs and is not within the limits of the error correcting algorithms (because too many data blocks have failed), then an unrecoverable error is reported to the CPU.

Thus it is seen that the present invention provides ways for detecting and correcting errors in a multiple device mass storage system resulting from power failure. One skilled in the art will appreciate that the present invention can be practiced by other than the described embodiments, which are presented for purposes of illustration and not of limitation, and the present invention is limited only by the claims which follow.

We claim:

1. A mass data storage apparatus comprising:
   a set of physical mass storage devices operatively interconnected so as to function as at least one logical mass storage device;
   means for reading blocks of data from and writing blocks of data to the set of physical mass storage devices; and
   means for validating blocks of data read from or written to the set of physical mass storage devices, wherein the validating means comprises mean for performing the following functions:
   (a) when writing a block of data to a device of the set, storing with the block of data on the device, information identifying the intended logical storage location for the block of data, and, when reading a block of data from a device of the set, detecting whether the block of data that is read was misdirected within the apparatus when written by comparing the identifying information stored with the read block of data and a logical address associated with the logical storage location form which the block of data is read; and
   (b) when writing a block of data to a device of the set, storing with the block of data on the device, information identifying the write operation by which the block of data is written and storing with a selected block of data on another device of the set, information identifying the same write operation, and, when reading the block of data, detecting whether the identified write operation was completed by comparing the identifying information stored with the read block of data to the identifying information stored with the selected block of data on another device.

2. In a mass data storage apparatus comprising a set of physical mass storage devices at least a plural number of which are operatively interconnected so as to function as a single logical data storage unit, the logical unit being operable in a transaction mode wherein data blocks stored in the logical unit may be individually modified, a method for detecting whether a write operation intended to modify a data block within the logical unit was completed, the method comprising:
   arranging the devices of the logical unit intended to store data blocks into groups such that the devices of each group are read and written in parallel;
   when modifying a data block on one device, storing a time stamp on the one device and other devices in the group indicating when the block of data was modified; and
   comparing the time stamp stored on the one device to the time stamps stored on the other devices of the group to determine if the time stamps correspond to one another.

3. A mass data storage apparatus comprising:
a set of physical mass storage devices operatively interconnected so as to function as at least one logical mass storage device;
means for reading blocks of data from and writing blocks of data to the set of physical mass storage devices; and
means for validating blocks of data read from or written to the set of physical mass storage devices, wherein the validating means comprises means for, when writing a block of data to a device of the set, storing with the block of data on the device information identifying the write operation by which the block of data is written and storing with a selected block of data on another device of the set information identifying the same write operation, and, when reading the block of data, detecting whether the identified write operation was completed by comparing the identifying information stored with the read block of data to the identifying information stored with the selected block of data on another device.

* * * * *